United States Patent [19]

Wersing et al.

[11] Patent Number: 4,900,972
[45] Date of Patent: Feb. 13, 1990

[54] ELECTRODE FOR PIEZOELECTRIC COMPOSITES

[75] Inventors: Wolfram Wersing, Kirchheim; Manfred Schnoeller, Haimhausen; Karl Lubitz, Ottobrunn; Jutta Mohaupt, Munich, all of Fed. Rep. of Germany

[73] Assignee: Siemens Aktiengesellschaft, Berlin and Munich, Fed. Rep. of Germany

[21] Appl. No.: 213,794

[22] Filed: Jun. 30, 1988

[30] Foreign Application Priority Data

Jul. 22, 1987 [DE] Fed. Rep. of Germany ....... 3724290

[51] Int. Cl.$^4$ ........................................... H01L 41/08
[52] U.S. Cl. ..................................... 310/364; 310/800
[58] Field of Search ......................... 310/364, 365, 800

[56] References Cited

U.S. PATENT DOCUMENTS

| | | | |
|---|---|---|---|
| 2,077,204 | 4/1937 | Bechmann | 310/364 X |
| 2,648,785 | 8/1953 | Tournier | 310/364 X |
| 3,803,545 | 4/1974 | Van Dyck et al. | 310/364 X |
| 3,872,332 | 3/1975 | Butter | 310/363 X |
| 3,912,830 | 10/1975 | Murayama et al. | 310/800 X |
| 4,404,489 | 9/1983 | Larson, III et al. | 310/363 X |
| 4,609,845 | 9/1986 | Soni et al. | 310/364 X |
| 4,695,756 | 9/1987 | Tanaka | 310/364 X |
| 4,701,659 | 10/1987 | Fujii et al. | 310/364 X |
| 4,786,837 | 11/1988 | Kalnin et al. | 310/364 |

FOREIGN PATENT DOCUMENTS

| | | |
|---|---|---|
| EP0154701 | 9/1985 | European Pat. Off. . |
| 51-3183 | 1/1976 | Japan ................... 310/364 |

Primary Examiner—Mark O. Budd
Attorney, Agent, or Firm—Hill, Van Santen, Steadman & Simpson

[57] ABSTRACT

The invention provides an electrode for piezoelectric composites having high acoustic attenuation. The electrode is composed of a first layer having high elasticity and lower conductivity and of a second layer lying thereabove that has higher conductivity. The invention also provides a method for the manufacture thereof. The first layer is an intrinsically conductive plastic directly deposited on the ceramic whose polymerization is initiated by chemical or anodic oxidation of the corresponding monomers. The second layer is fashioned of adequately conductive metal and is preferably first sputtered on or vapor-deposited in a thinner layer and is then subsequently electrolytically reinforced. Piezoelectric composites that exhibit high acoustic attenation and, thus, prevent an acoustic crosstalk between the individual transducer elements can be manufactured from piezoelectric ceramic lamina or foils provided with such electrodes. Such composites also withstand higher mechanical distortion (for example, due to thermal expansion), even if the ceramic is highly porous.

5 Claims, 1 Drawing Sheet

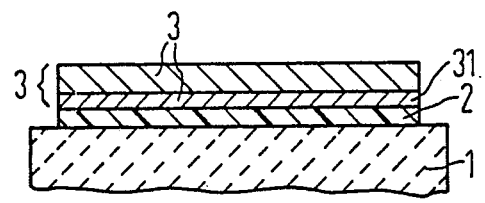

ELECTRODE FOR PIEZOELECTRIC COMPOSITES

BACKGROUND OF THE INVENTION

The present invention is directed to an electrode for piezoelectric composites. More specifically, the present invention is directed to an electrode for piezoelectric composites having acoustic attenuation as well as to a method for the manufacture thereof.

Piezoelectric transducers for ultra-sound transmitter/receiver equipment are known. For example, European Patent Application EP 015 4706 discloses a piezoelectric transducer for ultra-sound transmitter/receiver equipment.

One of the difficulties in making piezoelectric transducers is the problem of the intrinsic impedance of piezo-ceramic that differs extremely relative to air and of the difficulty, in matching the acoustics of the piezo-ceramic to the air that is connected therewith. The European patent application solves these problems by use of a sandwich structure. Lamellae or foils composed of piezoelectric ceramic material as well as laminae or foils of a dimensionally stable material that is not piezoelectric are stacked on top of one another in an alternate arrangement. These lamellae or foils are firmly joined to one another by, for example, gluing to form a one-piece member. The union of the materials is so secure that a subsequent shaping processing can still be carried out, for example by grinding or other erosion of a surface of this member that is usually cuboid. When the wavelength of the operating frequency of the transducer is long in comparison to the structural dimensions thereof or, respectively, relative to the distances between the individual lamellae or foils, then this is referred to as a composite.

In constructing these transducers, the dimensionally stable material located between the individual lamellae should be chosen so as to exhibit a value of intrinsic impedance that is many times lower than that of the ceramic. Such dimensionally stable materials include: polyurethane foam; silicone caoutchouc (rubber); polyethylene; polystyrol foam; and similar plastics.

These transducers also include electrodes. Thin metal layers of, for example, nickel or silver, that are sputtered on, are usually used as an electrode material for such sandwich transducers. Because of the high mechanical stressing they are subjected to, these electrodes represent the weak point of the overall transducer structure.

The electrodes must exhibit adequate strength so that they do not tear off given great mechanical distortion (for example, due to thermal expansion of the plastic). In order to achieve a sufficient strength, the thickness of the electrode layer on the ceramic lamellae must be appropriately reinforced. But, reinforcing the thickness of the electrode layer results in a reduction of the acoustic attenuation of the individual transducer elements (ceramic plus electrodes). An acoustic crosstalk between the transducer elements occurs, whereby the electrical or, respectively, acoustic signals (when receiving or, respectively, transmitting sound) are overlayed and distorted. An adequately great acoustic decoupling is thereby no longer possible.

The present invention overcomes the disadvantages of the prior electrodes and transducers by providing an electrode for the ceramic lamellae or, respectively, foils of piezoelectric composites that exhibits a high acoustic attenuation and is adequately elastic so that it does not tear off given the high mechanical distortions that occur.

SUMMARY OF THE INVENTION

The present invention provides an electrode for a ceramic lamellae, or foil of piezoelectric composite, that exhibits a high acoustic attenuation and is sufficiently elastic so as not to tear off given the high mechanical distortions that occur. To this end, the present invention provides an electrode composed of a first layer having high elasticity and low conductivity in comparison to ceramic and a second layer having higher conductivity lying thereabove.

In an embodiment of the present invention, the first layer is composed of an intrinsically conductive plastic deposited on the ceramic and the second layer is formed of an adequately conductive metal.

In an embodiment of the present invention, the thickness of the first layer is approximately 1 to about 15 um and the thickness of the second layer is approximately 0.1 to about 20 um.

The present invention also provides a method for manufacturing an electrode. Pursuant to the method of the present invention: a monomer from the class of 5-membered heterocyclenes, containing sulfur or nitrogen as a heteroatom, aniline or azulene is applied to the surface of a ceramic material; a polymer layer is formed by chemical or anodic oxidation of the monomers; and a metal layer is applied to the polymer layer.

In an embodiment of the method of the present invention, the polymerization ensues in the presence of a conducting salt.

In an embodiment of the method of the present invention, the metal layer is vapor-deposited.

In an embodiment of the present invention, the metal layer is sputtered on and, optionally, is subsequently electrolytically reinforced.

The electrodes constructed pursuant to the present invention can be used in piezoelectric composites for ultrasound transmission/reception equipment.

Additional features and advantages of the present invention are described in, and will be apparent from, the detailed description of the presently preferred embodiments and from the drawing.

BRIEF DESCRIPTION OF THE DRAWING

The FIGURE illustrates a cross-sectional view of a piezo-ceramic lamina with electrodes applied thereto.

DETAILED DESCRIPTION OF THE PRESENTLY PREFERRED EMBODIMENTS

The present invention provides an electrode for a ceramic lamellae, or foil of a piezoelectric composite, having high acoustic attenuation. The electrode is sufficiently elastic so that is does not tear off given high mechanical distortions that occur.

The electrode is composed of a first layer having high elasticity and low conductivity in comparison to the ceramic and a second layer having higher conductivity lying thereabove. In an embodiment, the first layer is composed of an intrinsically conductive plastic deposited on the ceramic and the second layer is formed of an adequately conductive metal.

The electrodes of the present invention exhibit great elasticity relative to the ceramic and, thus, exhibit a high resistance to tearing given high mechanical stresses. As a result of a high acoustic attenuation, they also avoid acoustic crosstalk. Moreover, the electrodes can be manufactured by an economical process and are also suitable for porous ceramic (above 10 percent).

The first layer having high elasticity is usually an intrinsically conductive plastic layer that can be directly polymerized on the ceramic surface from its monomer in a method disclosed by German Patent Application P 36 30 708.4. Suitable initial materials for the polymerization are monomers of the class of 5-membered heterocyclenes, or containing sulfur or nitrogen as heteroatom aniline or azulene.

A polymer layer is formed directly on the ceramic by chemical or anodic oxidation of the monomers. The oxidation of the monomers, in an embodiment of the present invention, can take place in the presence of a conducting salt. The chemical oxidation can proceed by preparation of a ceramic lamina with a corresponding oxidation agent and subsequent immersion into a solution containing the monomer. The reverse sequence is also possible, to wit, the treatment of the ceramic with the monomer proceeds first, for example, by spraying; subsequently, the lamina is dipped into a solution of the oxidation agent.

The second step can also be respectively carried out in a vapor phase containing the corresponding substances with the same result.

In anodic oxidation, the ceramic is wired as an anode in a solution containing the monomer. The ceramic is provided with a polymer coating by electrolysis toward a cooperating electrode.

Polymer layers produced in this manner have a conductivity of more than $10^{-2}$ S/cm. The high surface conductivity that is necessary for the operation of the piezoelectric component parts is achieved by a more conductive metal layer being applied thereto. This metal layer is applied through standard methods such as, for example, vapor-deposition or sputtering. It is also possible to first produce only a thin metal layer and to subsequently reinforce this electrolytically.

In an embodiment, the preferred layer thickness lies between approximately 0.1 to about 20 um. The elastic polymer layer lying therebelow preferably has a thickness of between approximately 1 to about 15 um. The ratio of layer thicknesses can be varied as desired dependent on the use of the piezoelectric component part and on the demands made of the component part that is derived therefrom.

Referring now to the FIGURE, a cross-section of an individual piezo-ceramic lamina having electrodes applied thereto is illustrated. The lamina 1 is composed of, in the embodiment illustrated, for example, porous lead titanate zirconate. In the embodiment illustrated, the lamina 1 has a thickness of approximately 500 um, a length of 20 mm, and a width of 10 mm.

In the illustrated embodiment, the lamina 1 is painted with a 10% alcoholic solution of iron perchlorate. After evaporation of the solvent, the lamina is exposed to a nitrogen atmosphere containing 10% pyrrole by volume at a temperature of 150° C. for thirty seconds. A dark coating 2 of polypyrrole forms after a few seconds.

The coating 2 exhibits a conductivity of $10^{-2}$ S/cm and a thickness of approximately 10 um.

The polymer coating 2 forms the first, elastic layer of the electrode and can be applied to the ceramic either surface-wide or only in desired regions thereof. In the embodiment illustrated in the FIGURE, the polymer coating 2 covers only defined regions of the upper side and/or underside of the ceramic lamina 1.

In a sputtering system, a thin nickel layer 31 having a thickness, for example, of approximately 0.1 um is applied by sputtering from a nickel target. The nickel layer 31 is then electrolytically reinforced to a thickness of 5 um in a bath containing nickel ions.

The ceramic lamina 1, provided with a double electrode layer 2 and 3, is subsequently worked to form a composite. A plurality of such lamina are thereby arranged on top of one another in a stack-like arrangement and are glued to one another. The lamina are cast out with plastic or are fixed at a defined distance from one another in some other manner. The individual lamina are also electrically contacted and wired in a suitable way. The finished composites can be used for ultrasound transmission and reception systems.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An electrode for piezoelectric composites having high acoustic attenuation comprising:
   a first layer composed of an intrinsically conductive plastic that is generated directly on a ceramic of a piezoelement by polymerization and having a higher elasticity than the ceramic; and
   a second layer composed of a metal having a higher conductivity than the plastic layer.

2. The electrode of claim 1 wherein:
   the thickness of the first layer is approximately 1 to about 15 um; and
   the thickness of the second layer is approximately 0.1 to about 20 um.

3. The electrode of claim 2 wherein:
   the thickness of the first layer is approximately 1 to about 15 um; and
   the thickness of the second layer is approximately 0.1 to about 20 um.

4. A piezoelectric composite for ultrasound transmission/reception equipment, including an electrode having high acoustic attenuation, the electrode comprising:
   a first layer, composed of an intrinsically conductive plastic deposited by polymerization on a ceramic, the layer having a high elasticity and a low conductivity in comparison to the ceramic; and
   a second layer composed of a metal.

5. The electrode of claim 4 wherein:
   the thickness of the first layer is approximately 1 to about 15 um; and
   the thickness of the second layer is approximately 0.1 to about 20 um.

* * * * *